(12) United States Patent
Stevens et al.

(10) Patent No.: US 10,931,252 B2
(45) Date of Patent: Feb. 23, 2021

(54) MAGNETOINDUCTIVE WAVEGUIDE

(71) Applicant: Oxford University Innovation Ltd., Oxford (GB)

(72) Inventors: Christopher Stevens, Oxford (GB); Ekaterina Shamonina, Oxford (GB); Jan Paszkiewicz, Oxford (GB)

(73) Assignee: Oxford University Innovation Ltd., Oxford (GB)

( * ) Notice: Subject to any disclaimer, the term of this patent is extended or adjusted under 35 U.S.C. 154(b) by 113 days.

(21) Appl. No.: 16/085,636

(22) PCT Filed: Mar. 17, 2017

(86) PCT No.: PCT/GB2017/050746
§ 371 (c)(1),
(2) Date: Sep. 17, 2018

(87) PCT Pub. No.: WO2017/158374
PCT Pub. Date: Sep. 21, 2017

(65) Prior Publication Data
US 2019/0044491 A1    Feb. 7, 2019

(30) Foreign Application Priority Data
Mar. 18, 2016    (GB) ..................................... 1604599

(51) Int. Cl.
*H03H 7/01*    (2006.01)
*H01Q 3/26*    (2006.01)
(Continued)

(52) U.S. Cl.
CPC ......... *H03H 7/0123* (2013.01); *H01P 1/2005* (2013.01); *H01P 1/20381* (2013.01);
(Continued)

(58) Field of Classification Search
CPC ......... H04B 5/00; H01P 1/203; H01P 1/2005; H01P 1/20381; H01P 7/088;
(Continued)

(56) References Cited

U.S. PATENT DOCUMENTS

2006/0044212 A1    3/2006    Wang et al.
2010/0301971 A1    12/2010    Yonak et al.
(Continued)

FOREIGN PATENT DOCUMENTS

CN    1153421    7/1997
CN    101027818    8/2007
(Continued)

OTHER PUBLICATIONS

Tamayama, Y et al, "Observation of modulation instability in a nonlinear magnetoinductive waveguide", Physical Review B, vol. 87, p195123, 2013.
(Continued)

*Primary Examiner* — Dao L Phan
(74) *Attorney, Agent, or Firm* — Reinhart Boerner Van Deuren P.C.

(57) ABSTRACT

A re-configurable magnetoinductive waveguide (300), comprising a plurality of resonator cells, wherein each resonator cell comprises a primary resonator (110) that is inductively coupled to a primary resonator (110) of at least one other resonator cell, and wherein at least one of the plurality of resonator cells is a controllable cell (100) which further comprises a control element (120), the control element (120) having an active control component (125) that is operable to adjust the impedance of the primary resonator (110) of the controllable cell (100) in response to a control signal; wherein: the control element (120) comprises a secondary resonator, the secondary resonator is inductively coupled to the primary resonator (110), and the active control compo-
(Continued)

nent (125) is arranged to vary the electrical properties of the secondary resonator in response to the control signal.

19 Claims, 10 Drawing Sheets

(51) Int. Cl.
| | |
|---|---|
| *H01Q 3/34* | (2006.01) |
| *H01P 1/203* | (2006.01) |
| *H01P 1/20* | (2006.01) |
| *H01P 7/08* | (2006.01) |
| *H01Q 3/28* | (2006.01) |
| *H03H 7/06* | (2006.01) |
| *H03H 7/13* | (2006.01) |
| *H03H 11/04* | (2006.01) |
| *H01Q 15/06* | (2006.01) |
| *H04B 5/00* | (2006.01) |
| *H01Q 15/02* | (2006.01) |

(52) U.S. Cl.
CPC ........... *H01P 7/088* (2013.01); *H01Q 3/2676* (2013.01); *H01Q 3/28* (2013.01); *H01Q 3/34* (2013.01); *H03H 7/06* (2013.01); *H03H 7/13* (2013.01); *H03H 11/04* (2013.01); *H01Q 15/02* (2013.01); *H01Q 15/06* (2013.01); *H03H 2210/012* (2013.01); *H03H 2210/025* (2013.01); *H04B 5/0075* (2013.01)

(58) Field of Classification Search
CPC ........ H03H 7/0123; H03H 7/06; H03H 11/04; H03H 7/13; H01Q 3/2676; H01Q 3/28; H01Q 3/34
See application file for complete search history.

(56) References Cited

U.S. PATENT DOCUMENTS

| | | |
|---|---|---|
| 2014/0211298 A1 | 7/2014 | Sayyah et al. |
| 2014/0225698 A1 | 8/2014 | Swirhun et al. |

FOREIGN PATENT DOCUMENTS

| | | |
|---|---|---|
| CN | 103972623 | 8/2014 |
| WO | WO 2004/083883 | 9/2004 |
| WO | WO 2011/070352 A1 | 6/2011 |
| WO | WO 2012/095682 A1 | 7/2012 |
| WO | WO 2012/172371 A1 | 12/2012 |
| WO | WO 2015/033168 | 3/2015 |
| WO | WO 2015/033168 A1 | 3/2015 |

OTHER PUBLICATIONS

Shadrivov, IV et al, "Tunable split-ring resonators for nonlinear negative-index metamaterials", Optics Express, vol. 14, No. 20, pp. 9344-9349, 2006.

Lazarides, N et al, "Nonlinear Magnetoinductive transmission lines", International Journal of Bifurcation and Chaos 21(8), pp. 2147-2159, 2011.

J. Paszkiewicz, E. Shamonina and C. J. Stevens, "Programmable magnetoinductive devices," 2016 10th International Congress on Advanced Electromagnetic Materials in Microwaves and Optics (METAMATERIALS), Chania, pp. 277-279, Sep. 19-22, 2016.

Gil I et al.; Varactor-loaded split ring resonators for tunable notch filters at microwave frequencies; Electronics Let, IEE Stevenage, GB, vol. 40, No. 21, Oct. 14, 2004.

Shamonina et al.; Magnetoinductive waveguide; Electronics letters 38.8 (2002); 371-373.

MAGNETOINDUCTIVE WAVEGUIDE

The present invention relates to a re-configurable magnetoinductive waveguide.

An array of magnetically coupled resonators is capable of supporting a propagating electromagnetic wave whose principle components are currents circulating in each resonator and their shared magnetic flux. Such waves have become known as magnetoinductive waves. A magnetoinductive waveguide is an arrangement in which a magnetoinductive wave can propagate (e.g. Shamonina, E., et al. "Magnetoinductive waveguide." Electronics letters 38.8 (2002): 371-373).

Some other examples of existing magnetoinductive waveguides are given in WO2015/033168, WO2012/172371 and WO2011/070352.

According to a first aspect of the invention, there is provided a re-configurable magnetoinductive waveguide, comprising a plurality of resonator cells. Each resonator cell comprises a primary resonator that is inductively coupled to a primary resonator of at least one other resonator cell. At least one of the plurality of resonator cells is a controllable cell which further comprises a control element. The control element has an active control component that is operable to adjust the impedance of the primary resonator of the controllable cell in response to a control signal.

Each primary resonator may be galvanically isolated each of the other primary resonators (i.e. the only coupling between adjacent primary resonators may be inductive and capacitive coupling). In other embodiments, adjacent primary resonators may be conductively coupled.

Each primary resonator may be arranged with a resonant frequency that is nominally equal to a design frequency of the waveguide.

The active control element may be operable to adjust the impedance of the primary resonator at a design frequency. The active control element may be operable to adjust the impedance over a range of frequencies (i.e. to adjust the frequency response of the primary resonator).

The control element may be inductively coupled to the primary resonator. The control element may be conductively and/or capacitively coupled to the primary resonator. The control element may comprise an active control component that is conductively or capacitively coupled to the primary resonator and an active control component that is inductively coupled to the primary resonator (e.g. in a secondary resonator)

The control element may comprise a secondary resonator, inductively coupled to the primary resonator. The active control component may be arranged to vary the electrical properties of the secondary resonator in response to the control signal.

The coupling between the first and second resonator means that the coupled system will have two modes: a first mode in which the currents in the primary and secondary resonator are in phase, and a second mode in which the currents in the primary and secondary resonator are out of phase. The secondary resonator may be operable to cause an anti-resonance in the impedance of the primary resonator at the resonant frequency of the un-coupled secondary resonator. Using an active control component to change the properties of the properties of the secondary resonator may result in a change in the modes of the coupled system, thereby changing the effecting impedance of the primary resonator.

The secondary resonator may comprise a capacitor, and the active control component may be arranged in series with the capacitor.

The secondary resonator may comprise a capacitor, and the active control component may be arranged in parallel with the capacitor.

The secondary resonator may have a resonant frequency that is matched to a resonant frequency of the primary resonator to within 1%, 2%, 5%, or 10%.

The control element may comprise an inductor and the active control component may be in series with the inductor and operable to vary the effective resistance of the control element in response to the control signal.

The control element may comprise an inductor, and the active control component may be in parallel with the inductor and operable to vary the effective inductance of the control element in response to the control signal.

The control element may comprise a further active control component in parallel with the inductor, and the control element may be operable to vary the effective inductance of the control element in response to the control signal.

The active control component may be conductively coupled to the primary resonator.

The active control component may comprise a variable capacitor, arranged to vary a resonant frequency of the primary resonator (e.g. by varying the capacitance of the primary resonator).

The active control component may be connected in series with a capacitor of the primary resonator, and may be operable to vary the effective resistance of the primary resonator in response to the control signal.

The control element and corresponding primary resonator of the at least one controllable cell may be disposed on different substrates.

The resonator cells may be arranged in an three-dimensional, two-dimensional or one-dimensional array.

Each primary resonator may comprise a primary conducting loop (e.g. arranged in a split-ring configuration).

The control element may comprise a secondary conducting loop, adjacent to the primary conducting loop.

The secondary conducting loop may be substantially concentric with the primary conducting loop (or substantially within the primary conducting loop). The secondary conducting loop may be substantially coplanar with the primary conducting loop.

The secondary conducting loop may be offset from the primary conducting loop in a direction having a component parallel with an axis of the primary conducting loop (e.g. in a direction along the axis).

The waveguide may comprise a plurality of controllable cells, arranged in a two-dimensional array, and the active control components of each controllable cell may be individually addressable using a plurality of row control lines and a plurality of column control lines.

The active control components may be responsive to an electrical signal, and/or an optical signal.

According to a second aspect of the invention, there is provided a reconfigurable filter comprising the waveguide according to the first aspect.

According to third aspect of the invention, there is provided a radio frequency processing apparatus comprising the waveguide according to the first aspect and a plurality of antenna elements coupled to respective resonator cells, the waveguide configured to perform direct radio frequency processing of antenna signals provided to and/or received from the antenna elements.

The apparatus may further comprise a microprocessor, arranged to provide control signals to the controllable cells of the waveguide to configure the waveguide to perform beam forming with the antenna signals.

Embodiments of the invention will now be described, purely by way of example, with reference to the accompanying drawings, in which.

Figure 1:
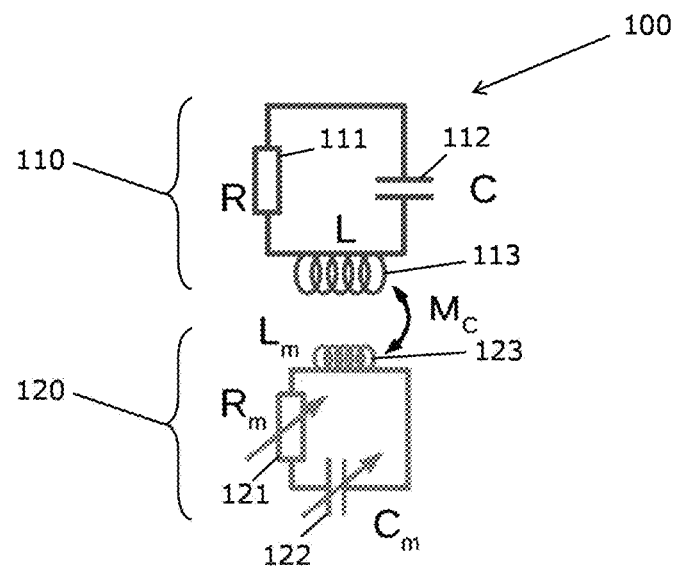
FIG. 1 is a schematic circuit diagram of a controllable cell, in which the control element comprises a secondary resonator that includes an adjustable effective resistance and an adjustable effective capacitance.

Referring to FIG. 1, a controllable resonator cell 100 is shown, suitable for use as part of a waveguide, in accordance with an embodiment. The controllable cell 100 comprises a primary resonator 110 and a control element 120. The primary resonator 110 comprises a capacitor 112, inductor 113 and a resistor 111. For the sake of simplicity in this disclosure, capacitance, resistance and inductance are often depicted as lumped elements, but it will be appreciated that in a real system at least some of these may be distributed (at least to some extent). For instance, a conductor loop may have distributed self-inductance and resistance, and some distributed capacitance with any adjacent conductors (or ground plane).

The control element 120 comprises a secondary resonator that includes a capacitor 122, resistor 121 and inductor 123. The secondary resonator is inductively coupled to the primary resonator 110 by the mutual inductance $M_c$ between the inductors 113, 123. The resistor 121 of the secondary resonator is a variable resistor, and the capacitor 122 is a variable capacitor (both responsive to control signals, that are not shown).

Using an inductively coupled control element 120 avoids the need to interfere with the design of the primary resonator 110. Adding tuning elements into the primary resonator 110 may degrade the Q factor thereof, or reduce the mutual coupling between adjacent primary resonators of the waveguide.

Since the secondary resonator 120 is inductively coupled to the primary resonator 110, it contributes to the impedance thereof. Varying the resistance and capacitance of the control element 120 therefore affects the impedance of the primary resonator 110.

The impedance contribution $Z_e$ from the secondary resonator 120 is given by:

$$Z_e = \frac{\omega^2 M_c^2}{Z_m} \quad (1)$$

Where $Z_m = R_m + j(\omega L_m - 1/\omega C_m)$, and the impedance of the primary resonator $Z_p$ is given by:

$$Z_p = R + j(\omega L - 1/\omega C) + Z_e \quad (2)$$

Several possibilities for the control element 120 can be considered. Where $R_m$ is very large, the contribution $Z_e$ of the secondary resonator 120 to the impedance $Z_p$ of the primary resonator 110 will be very small. Where $R_m$ is small, and $L_m C_m = LC$ (i.e. the resonant frequencies of the primary and secondary resonators 110, 120 are matched), the effect of the secondary resonator will be to cause an anti-resonance (high impedance) in the impedance of the primary resonator 110 at the resonant frequency $\omega_c$ of the un-coupled primary resonator 110 ($\omega_c = 1/\sqrt{LC}$). The coupled system of the primary and secondary resonator 110, 120 will have two resonant modes: a first mode in which the currents in the inductors 113, 123 of the primary and secondary resonator are in-phase, and a second in which these currents are out-of-phase. Tuning $R_m$ allows the effect of the secondary resonator to be changed. For instance, the effect of a secondary resonator 120 with matched frequency and a larger $R_m$ would be to reduce the Q factor of the resonance of the primary resonator 110.

Where $R_m$ is small, and $L_m C_m \neq LC$ (i.e. the resonant frequencies of the primary and secondary resonators 110, 120 are not matched), the effect of the secondary resonator 120 will be to cause two coupled modes of current oscillation with different frequencies.

Notably, not all nested split-ring structures can be considered to comprise a primary resonator and a secondary resonator that are inductively coupled in accordance with the present disclosure. For example, the prior art includes double split-ring resonators that comprise an inner and outer split ring that are concentric and separated by a small gap. Due to the strong coupling between the inner and outer ring, such double split-ring resonators are not typically operable with the first and second resonant mode described above, characteristic of a coupled system of a primary and secondary resonator. The mutual inductance between the inner and outer ring of a typical double split-ring resonator is approximately equal to the self-inductance of the outer ring. For a coupled system of primary and secondary resonators to be operable with a first and second resonant mode, it may be necessary for the mutual inductance between the primary and secondary resonator to be less than half the self-inductance of the primary resonator.

Figure 2:
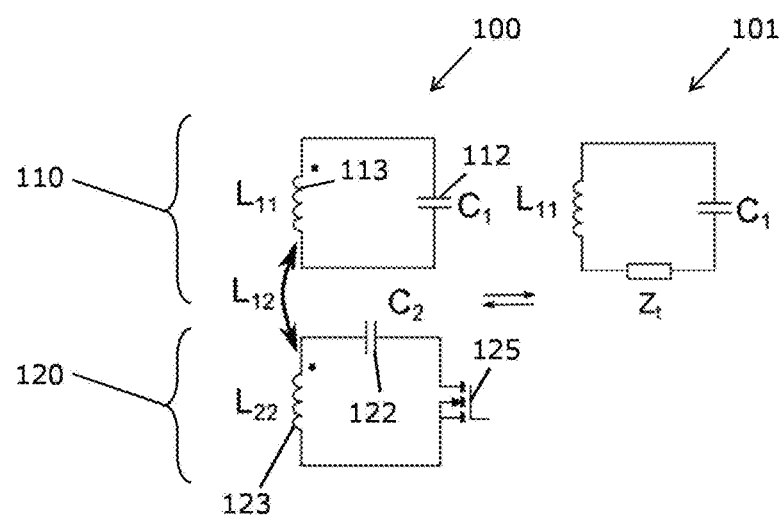
FIG. 2 is a schematic circuit diagram of a controllable cell, in which the control element comprises a secondary resonator and an active control component arranged in series with a capacitor of the secondary resonator.

FIG. 2 shows an example of a controllable cell 100, similar to that of FIG. 1, in which the control element 120 includes a secondary resonator. The secondary resonator comprises an active control component 125 for varying the effective resistance thereof. The active control component 125 may comprise a transistor, photodiode or any component that can change resistance in response to a control signal. In FIG. 2 a MOSFET transistor is used at the active control component 125, and the control signal is a voltage applied to the gate of the transistor. When the transistor is in a saturation state, it presents a low resistance, and when in a subthreshold state, a high resistance. The control element 120 will affect the impedance of the primary resonator 110 much more when the transistor is in a saturation state that when in subthreshold state. The control signal to the transistor can be thought of as a digital on-off, turning on and off the effect of the control element 120. Alternatively, the active control component 125 may be operated with a greater resolution, to modulate the effect of the control element 120 (e.g. by operating the transistor in a saturation mode).

Figure 3:
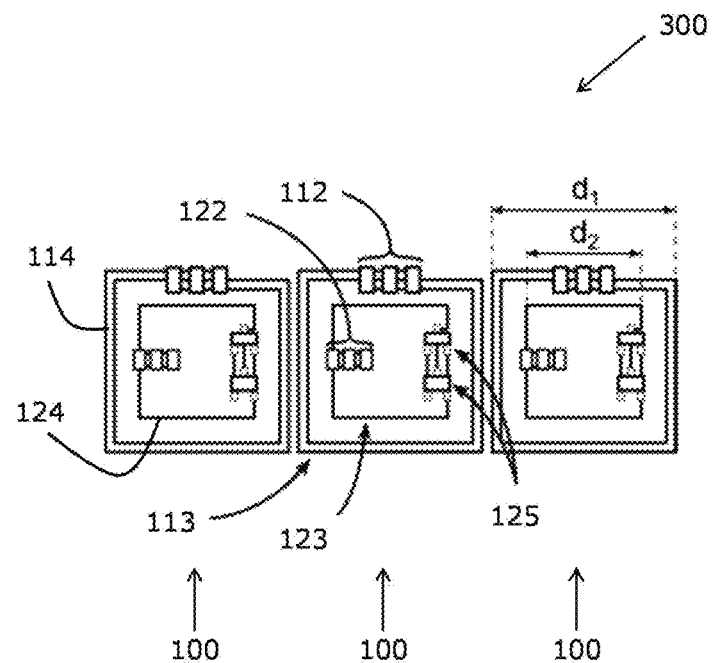
FIG. 3 is a layout of a waveguide, comprising a linear array of three controllable cells in accordance with FIG. 2.

FIG. 3 shows a waveguide 300, comprising a linear array of three controllable resonator cells 100. Each controllable cell 100 comprises a primary resonator 120, arranged concentrically with a secondary resonator of a control element 120. The inductance and resistance of the primary resonator is provided by a primary loop 114 which is a split-ring resonator. The split is bridged by a capacitance 112. In this embodiment more than one (e.g. three) discrete capacitors are used, which improves matching by averaging any capacitor variation. The secondary resonator is within the primary resonator 110, and comprises a similar split ring resonator arrangement with at least one discrete capacitor 122 (e.g. three) bridging the split. Each secondary resonator further comprises an active control component 125, in the form of three parallel MOSFET transistors (which reduces resistance in the saturation state).

Placing the secondary resonator within the primary resonator 110 has a number of advantages. This arrangement means that the secondary resonator does not affect the spacing or coupling between the primary resonators, while at the same time achieving good inductive coupling between the primary and secondary resonators. Furthermore, any coupling between different secondary resonators will be minimised.

Figure 4:
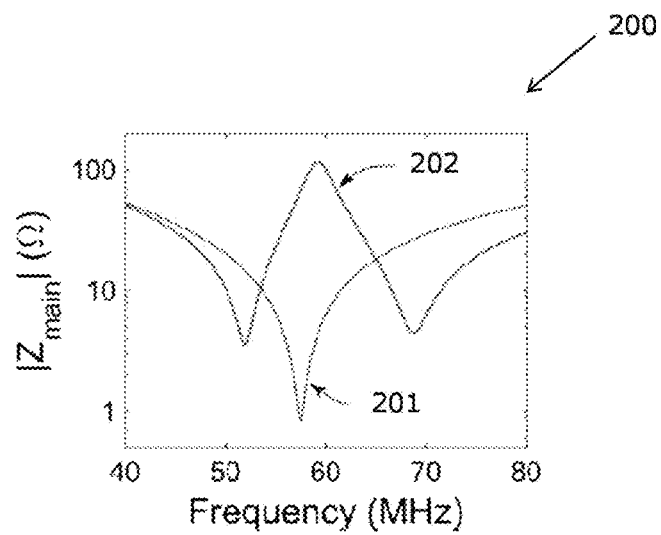
FIG. 4 is a graph showing the impedance of a controllable cell in accordance with FIG. 2.

FIG. 4 shows the impedance of a single controllable cell 100, as shown in FIGS. 2 and 3, in a first state 201 in which the active control component 125 has a high resistance (i.e. the transistors are sub-threshold), and in a second state 202 in which the active control component 125 has a low resistance (i.e. the transistors are saturated). In the first state 201, the primary resonator 110 has a low impedance of 0.8 ohms at the design frequency $2\pi\omega_c$, which in this case is 57.2 MHz. In the second state 202, the primary resonator 110 has a high impedance of 66 ohms at the design frequency. The Q factor in the first state is 80. The change in impedance at the design frequency may be at least a factor of 10 (in this case, a factor on the order of 100 is achieved).

In the example of FIG. 4, the primary resonator has an inductance $L_{11}$=193 nH, a capacitance $C_1$=36 pF, and edge length $d_1$=20 mm, the secondary resonator has an inductance $L_{22}$=38.2 nH, capacitance $C_2$=198 pF and edge length $d_2$=12.5 mm, and mutual coupling $L_{12}$=22.8 nH. The primary and secondary resonator are nested square printed copper coils with surface mount capacitors and transistors. The impedance measurements were inferred from an $S_{21}$ measurement performed using coupled non-resonant probes.

Figure 5:
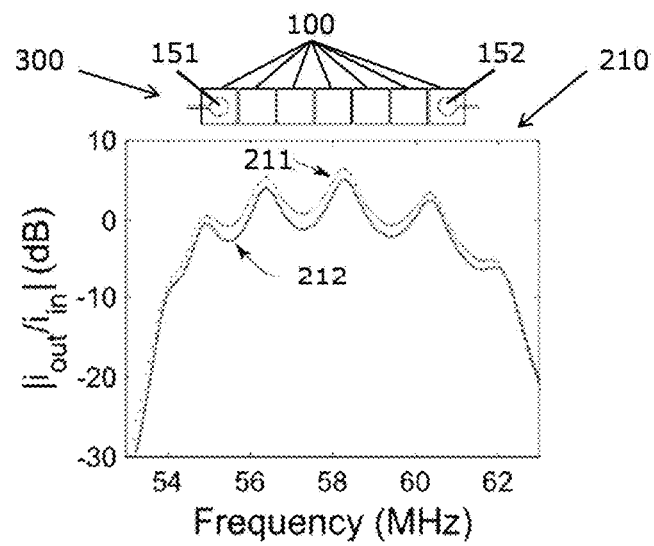
FIG. 5 shows an example waveguide comprising a linear array of seven controllable cells in accordance with FIG. 2, together with a graph showing the modelled and measured transmission characteristics with all controllable cells in a low impedance configuration.
Figure 6:
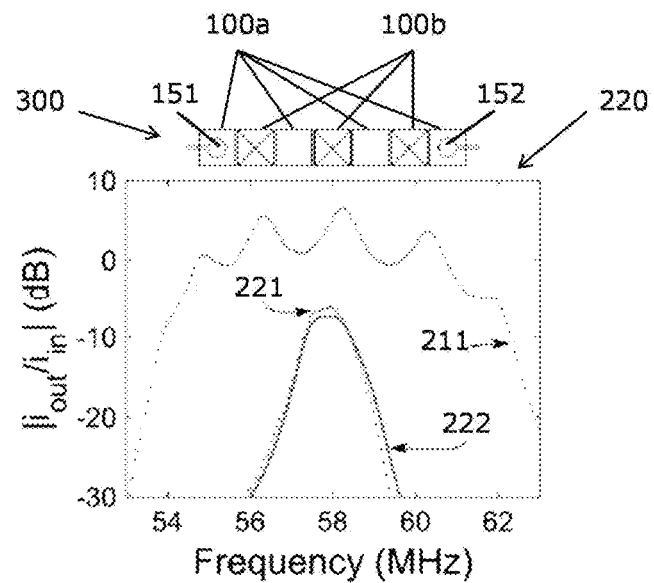
FIG. 6 shows the same waveguide as in FIG. 5, but with alternate controllable cells in a high impedance configuration, along with a graph showing the modelled and measured transmission characteristics of this waveguide configuration.
Figure 7:
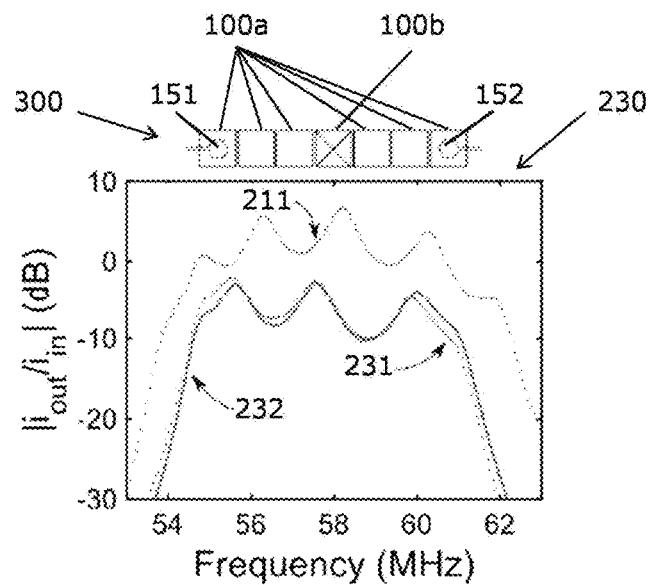
FIG. 7 shows the same waveguide as in FIGS. 5 and 6, but with only the central cell in a high impedance configuration, along with a graph showing the modelled and measured transmission characteristics of this waveguide configuration.

FIGS. 5 to 7 show a magnetoinductive waveguide (MIW) 300 according to an embodiment, comprising a one-dimensional array of seven controllable cells 100, similar to those shown in FIGS. 2 and 3, in various configurations. The state of each cell 100 is controllable by varying the gate-source voltage of the transistors 125, with a low gate-source voltage (e.g. 0V) for a low impedance at the design frequency, and a high-gate source voltage (e.g. 5V) for a high impedance at the design frequency. Each graph in FIGS. 5 to 7 shows a transfer function in the form of the ratio of input current (at input node 151) to output current (at output node 152), as a function of frequency.

The transfer function of each cell was measured by placing an 8 mm diameter, non-resonant loop probe at a height of 6 mm below the centre of the first cell to act as the signal input. A similar probe was placed 6 mm above the centre line of the MIW 300. The probe could be moved along the length of the MIW 300 and acted as the output.

The two probes were connected to a vector network analyser and the $S_{21}$ value was measured for different configurations of the MIW 300. A background reading was taken without the MIW 300 present. The transfer function ratio was determined by subtracting the background $S_{21}$ from the output $S_{21}$ to remove the effect of direct coupling between the two probes, then dividing the output $S_{21}$ taken at the last cell by the output $S_{21}$ taken at the first cell (as plotted in FIG. 2). This effectively results in a ratio of currents between the last and first cells. Since the probes are sensitive to currents flowing in both the main and control elements within a unit cell, the inferred 'current' is actually a linear combination of the two currents, dependent on the mutual inductance of each resonator with the probe.

In FIG. 5, each cell 100 is in the first, low-impedance state, substantially corresponding with a magnetoinductive waveguide comprising only the primary resonators (without the control elements). The measured transfer function 211 is in good agreement with the modelled transfer function 212.

In FIG. 6, an alternative configuration of the same waveguide 300 is demonstrated, in which a control signal has been applied to place the controllable cells 100 in alternate high 100b and low 100a impedance states. The measured transfer function 221 and modelled transfer function 222 for this configuration is compared with the measured transfer function 211 with all cells 100 in the low impedance state. The passband of the waveguide 300 is narrows in this state: the waveguide can be considered as a Bragg reflector.

In FIG. 7, the waveguide 300 is configured (using control signals) with only the central cell 100 in a high impedance state. This introduces an impedance mismatch into the MIW 300, resulting in a reduction in signal power reaching the final cell, and a change in the standing wave pattern, moving the peaks of the transfer function.

The example configurations of FIGS. 5 to 7 show how a waveguide 300 may be re-configured using control signals to perform different functions, such as filtering and switching.

Figure 8:
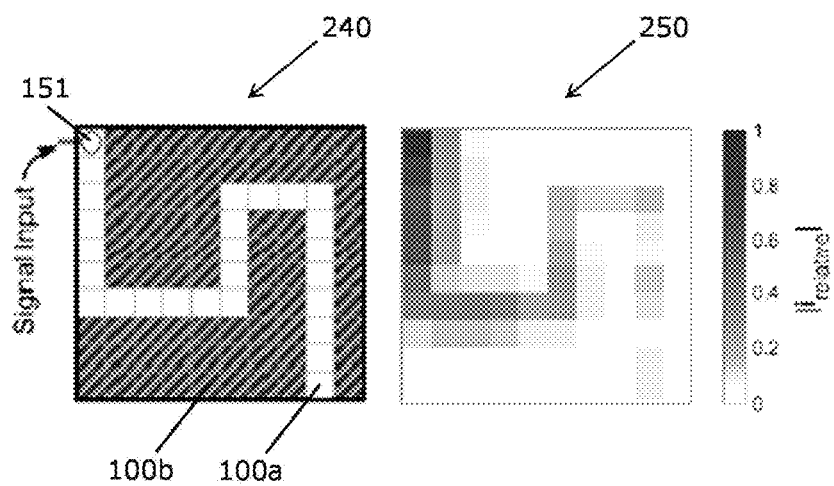
FIG. 8 shows an example of a waveguide, comprising an 10×10 two-dimensional array of controllable cells in accordance with FIG. 2, illustrating modelled current flow in each cell in a particular waveguide configuration.

FIG. 8 shows an example configuration state 240 for a two dimensional waveguide 300, comprising a 10×10 two dimensional array of controllable cells. In the example state 240, a single cell-wide track of cells 100a are configured in a low impedance state, with the other cells 100b of the array in a high impedance state. A simulation 250 of the relative current flow in each cell shows the injected signal following this path, albeit with a significant level of attenuation between the input and output cells.

Figure 9:
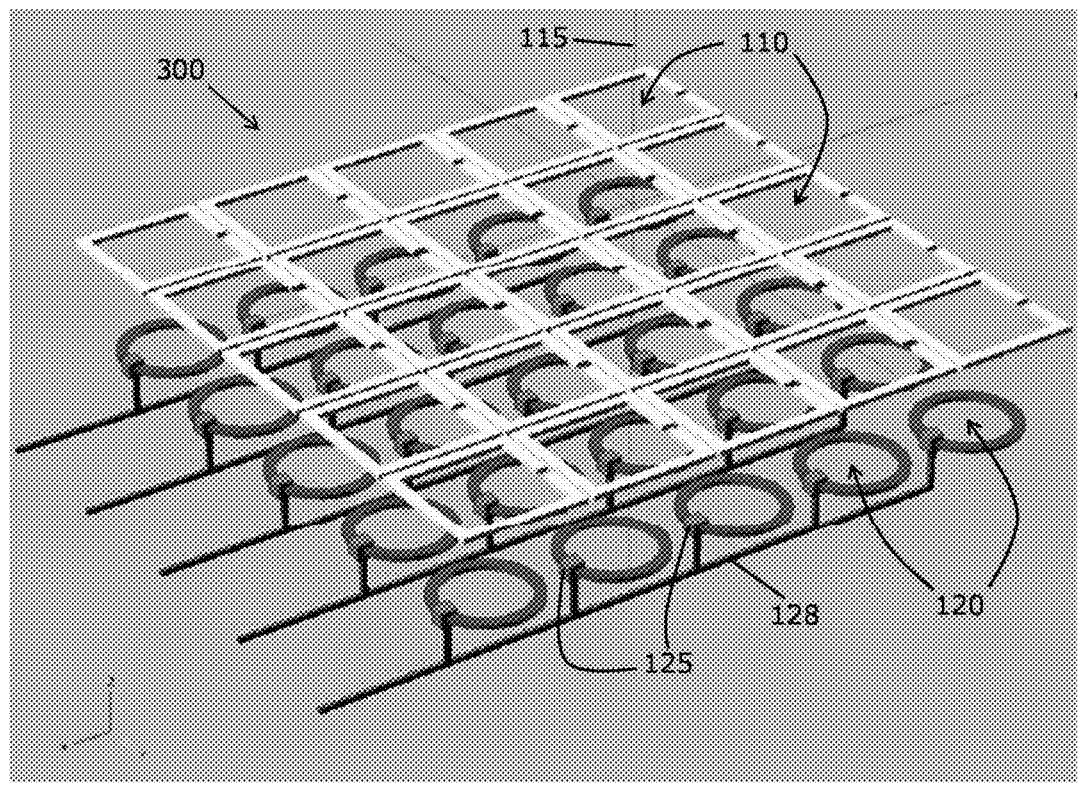
FIG. 9 is an isometric view of a waveguide, comprising a 5×5 two-dimensional array of cells, in which each secondary resonator is concentric with, but axially offset from the corresponding primary resonator.

FIG. 9 shows a region of an MIW 300 comprising a 5×5 two dimensional array of controllable cells 100. The primary resonators 110 comprise rectangular split-ring resonators arranged in a first plane. The control elements 120 comprise a corresponding two dimensional array of secondary resonators, here depicted as circular, each having an active control component 125, addressed by a control line 128. The control elements 120 are arranged in a second plane, that is offset from the first plane along the axis 115 of the primary resonators. The secondary resonators are substantially co-axial with the primary resonators 110.

In this sort of arrangement the primary resonators 110 may be formed on a first substrate, and the control elements 120 may be formed on a separate substrate. The primary resonators 110 and control elements 120 may subsequently be aligned and brought into proximity. In other embodiments the control elements 120 and primary resonators 110 may be implemented in a multi-layer fabrication process on the same substrate, or may be adjacent elements in the same conductive layer. For instance, the control elements 120 may be formed under or over the primary resonators 110.

A MIW 300 according to an embodiment is scalable to an arbitrary number of cells, either in 2D or 3D array. The cells may be considerably smaller that the example embodiments described herein (which merely serve to demonstrate proof of principle), and may have much higher frequencies of operation (e.g. on the order of GHz or 10s of GHz).

Although example embodiments have been disclosed in which each cell of the waveguide is controllable, this is not essential. The waveguide can still be reconfigured if only a subset of the cells (as few as just one) are controllable. The primary resonators may be nominally identical (i.e. having the same design), or may, in some embodiments, differ.

One application for a MIW according to an embodiment is in a RF (radio frequency) receiver or transmitter. While it is now possible to design and build a reconfigurable digital integrated circuit to perform digital processing (e.g. a FPGA), it has not previously been possible to provide a reconfigurable arrangement with the same degree of flexibility that is capable of direct RF processing. Despite many years of effort and development in the field of frequency agility, it is often still necessary to use different antennas and filters for various frequency bands required in a system.

Figure 10:
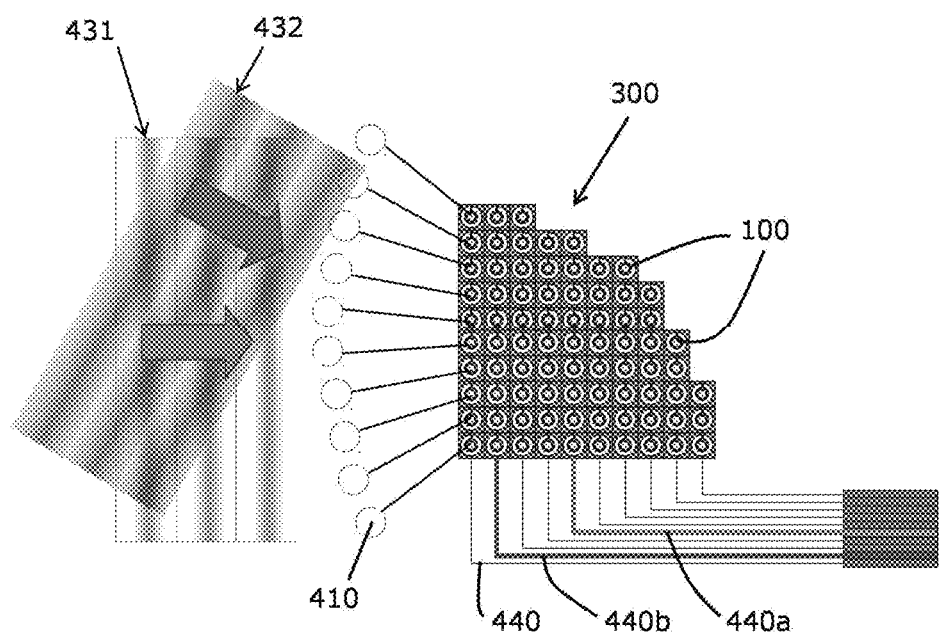
FIG. 10 is an example of a receiver architecture comprising a magnetoinductive waveguide configured to perform beam forming/steering with an antenna array.

Referring to FIG. 10, an example of a receiver architecture comprising a MIW 300 according to an embodiment is shown. An array of antennas 410 are electrically coupled to cells of the MIW (e.g. along the edge, although other arrangements are contemplated). Signal lines 440 are coupled to other cells of the MIW (e.g. along a different edge). The MIW 300 in this embodiment is configured (e.g. using control signals) to form a lens, in which the signals incident on the antenna array 410 in different directions are propagated and are focussed through the MIW 300 into different signal lines 440. The MIW 300 is effectively performing beam steering/forming operations directly on the RF signals from the antennas. A beam 431 incident substantially perpendicular to the antenna array may be focussed by the MIW onto a first signal line 440a. A beam 432 incident at an angle to the antenna array may be focussed by the MIW onto a second signal line 440b. The different signal lines may correspond with different angles of incidence. It will be understood that this approach is equally applicable to transmit and receive operations—current can flow either from the signal lines 440 to the antennas 410 via the MIW 300, or from the antennas 410 to the signal lines 440 via the MIW 300.

Re-configuring the MIW in the arrangement of FIG. 10 will change the transfer function between the antenna elements and the signal lines, effectively reconfiguring the antenna properties as they are seen by the system. A huge range of characteristics may be achievable by re-configuring the MIW 300.

Figure 11:
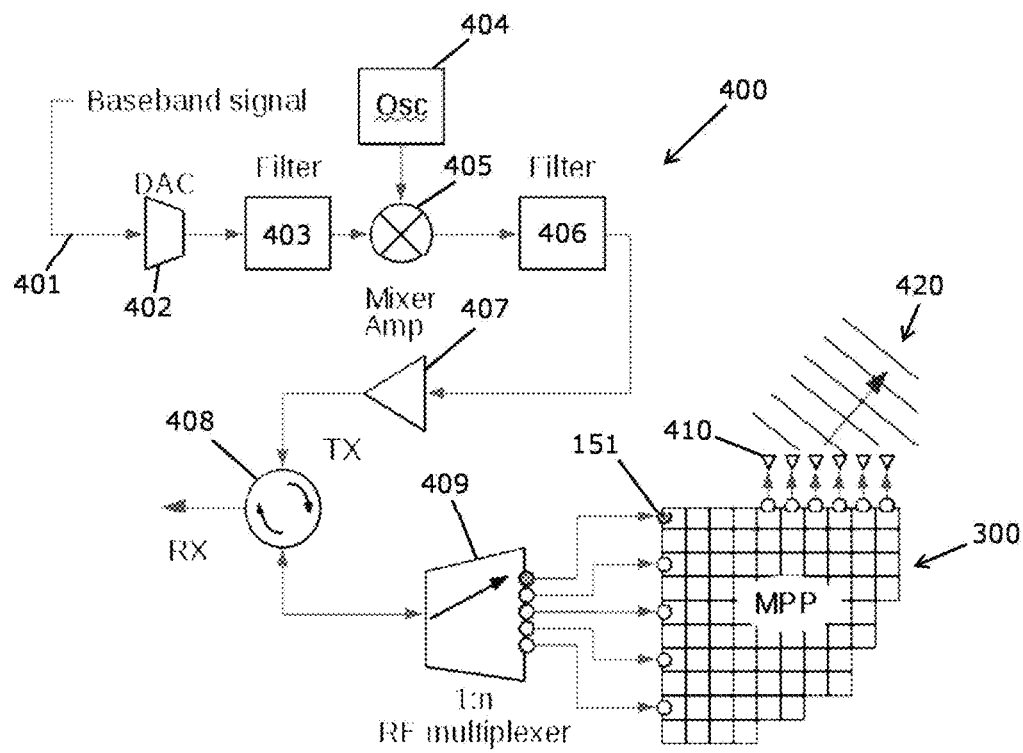
FIG. 11 is an receiver/transmitter architecture comprising a magnetoinductive waveguide, arranged to perform beam forming/steering by direct radio frequency processing.

Referring to FIG. 11, a further example of a RF front end 400 is shown, with reference to a transmit operation. The RF front end 400 comprises base band signal line 401 (carrying digital information to be transmitted), DAC 402, first filter 403, oscillator 404, mixer 405, second filter 406, mixer amplifier 407, circulator 408, multiplexer 409, MIW 300 and antennas 410. The base band signal is converted to an analog signal at the DAC 402, and filtered (at first filter 403), mixed (at mixer 405) to produce a modulated carrier signal, and then filtered again (at second filter 406). The modulated carrier signal is then amplified, and provided to the multiplexer 409 via a circulator 408.

The multiplexer 409 is configured to select a feed location 151 at which the signal is transmitted to, or received from, the MIW 300. The MIW 300 may be configured (using control signals) as a reflecting lens, similar to that used in FIG. 10. When the modulated carrier signal is applied to the topmost feed location 151, the MIW may propagate and focus the modulated carrier to excite the antennas so as to transmit a beam that propagates at a specific angle to the antenna array 410. Selecting a different feed location will result in a different beam direction being formed from the antenna array. Re-configuring the MIW 300 changes the transfer function between the feed locations and the antenna elements, providing for a high degree of flexibility in the configuration of the system.

An alternative arrangement of MIW 300 may be envisaged where, instead of the feed locations each corresponding with beam angle, they alternatively or additionally correspond with different beam widths or antenna gains.

The RF front end 400 depicted in FIG. 11 uses only a single RF chain (of DAC-filter-mixer-filter-amplifier). In a conventional implementation (not using the MIW 300) an RF chain may be provided for each antenna element, so that the relative phase and amplitude at each antenna element is controllable to enable beamforming. This is in contrast to the RF front end 400 of FIG. 11, which instead performs direct RF processing with a reconfigurable MIW 300 using only a single RF chain.

In some embodiments the mixer 409 may be implanted in the MIW 300. For example, the MIW may comprise a switching or routing functionality. For example, the MIW 300 may be re-configurable to change how an input cell of the MIW couples to the antenna array 410 via the other cells of the MIW 300, so that the switching in beam steering is achieved by reconfiguring the MIW 300, rather than by using an multiplexer that is not part of the MIW 300.

Figure 12:
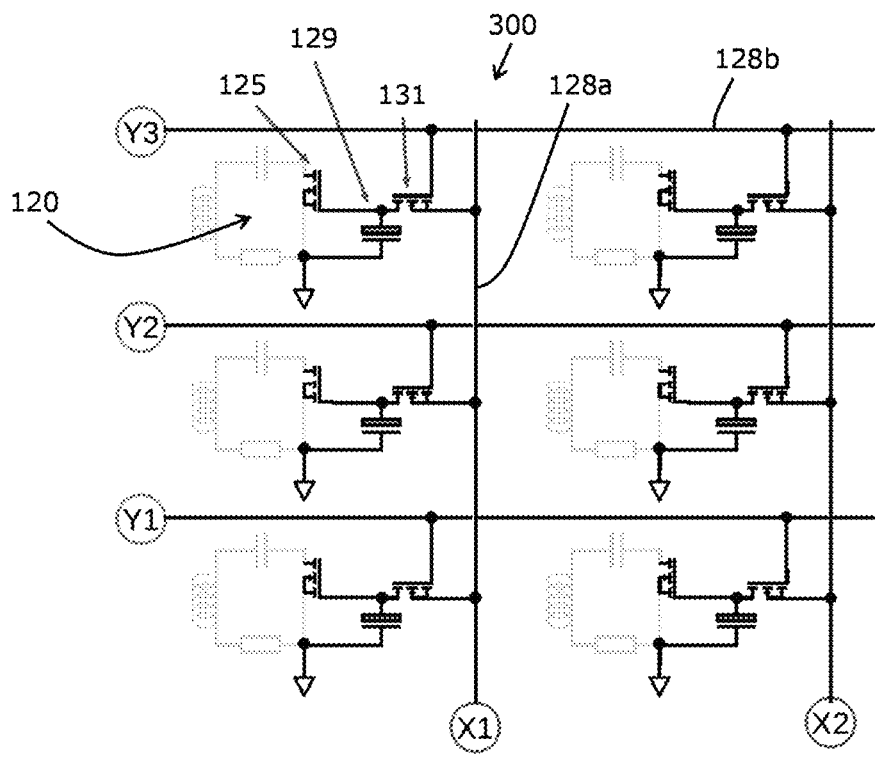
FIG. 12 is an schematic of an addressing scheme for controlling active control components of a reconfigurable magnetoinductive waveguide.

FIG. 12 illustrates one way in which active control components 125 of a MIW 300 may be addressed and provided with control signals. The MIW 300 of FIG. 12 comprises a 2×3 array of controllable cells. Only the control elements 120 are shown (the primary resonators are omitted for clarity), which each comprise a secondary resonator as shown in FIG. 2. The active control element 125 in this embodiment is a transistor, and the voltage applied to the gate is held by control capacitor 129. The control capacitor 129 is charged and discharged via a column signal line 128a, X1, X2. The current path from the column signal line 128a, X1, X2 to the respective control capacitor 129 is provided by a row enable transistor 131, which will only pass current (to change the voltage held by the control capacitor 129) when activated by the row signal line 128b, Y1, Y2, Y3. Each active control element 125 can be addressed in this way by advancing through the array a row at a time.

First, voltages may be applied to each column single line, corresponding with the desired voltage at each control capacitor in the selected row. The selected row control line may then be provided with an appropriate voltage to saturate the row enable transistor, so that the voltage on each column signal line is provided to the control capacitors 129 in the selected row. This process may be repeated for each row in the array.

Although embodiments have been described in which the tuneable element 120 comprises a secondary resonator, this is not essential. A range of different arrangements for adjusting the impedance of the primary resonator are possible, some of which will be described with reference to FIGS. 13 to 19.

Each of FIGS. 13 to 19 show a controllable cell 100 comprising a primary resonator 110. The primary resonator 110 in each of FIGS. 13 to 19 comprises a resistor 111, capacitor 112 and inductor 113. The control element 120 is different in each of FIGS. 13 to 19.

Figure 13:
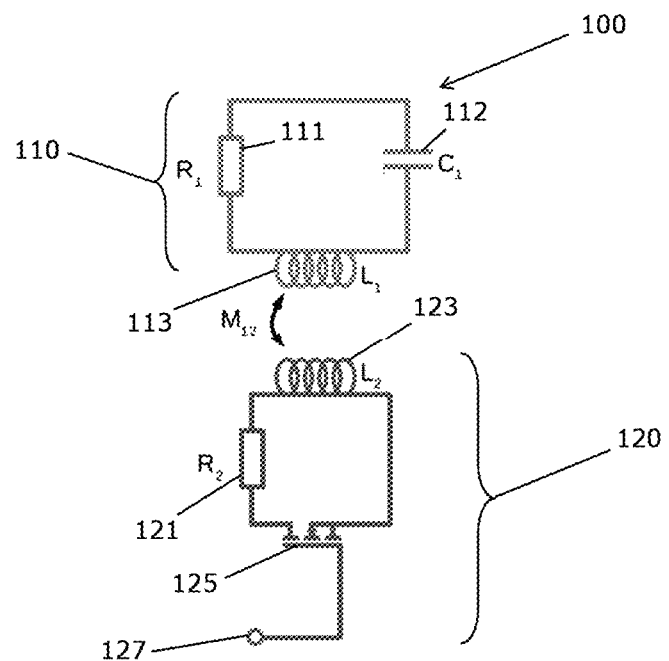
FIG. 13 is an controllable cell in which the control element comprises an inductor and resistor connected in series with an active control component.

In the controllable cell 100 of FIG. 13, a control element 120 is inductively coupled to the primary resonator 110. The control element 120 comprises an inductor 123, resistor 121 and active control component 125 (e.g. transistor) connected in a series loop. The inductive coupling $M_{12}$ is between the inductors 113, 123 of the primary resonator and control element 120. The active control component 125 controls the effective resistance of the control element 120. Varying the resistance of the control element 120 in this embodiment varies the Q factor of the primary resonator 110.

Figure 14:
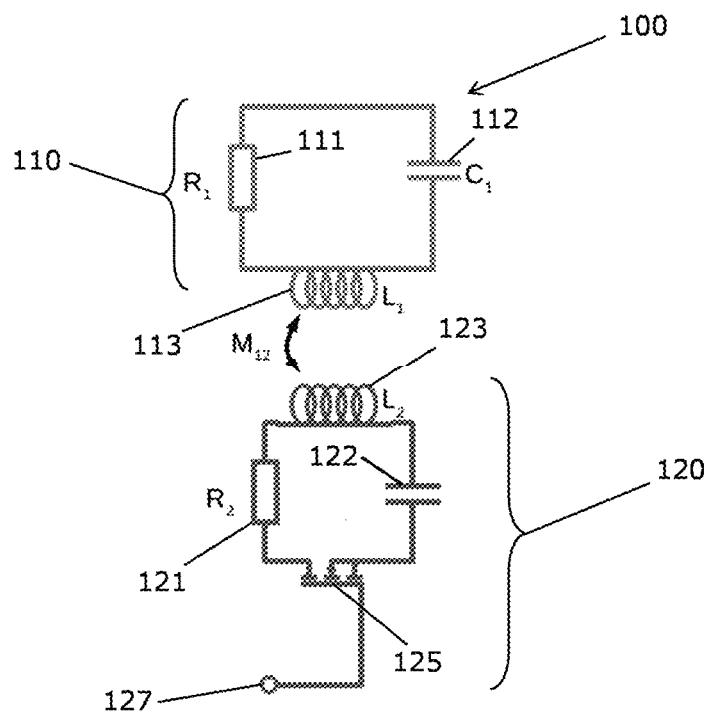
FIG. 14 is an controllable cell similar to that shown in FIG. 2.

In the controllable cell 100 of FIG. 14, the control element 120 comprises a secondary resonator, inductively coupled to the primary resonator 110. The control element 120 comprises an inductor 123, capacitor 122, resistor 121 and active control component 125 (e.g. transistor) connected in a series loop. The inductive coupling $M_{12}$ is between the inductors 113, 123 of the primary resonator 110 and control element 120. The active control component 125 controls the effective resistance of the control element 120. Varying the resistance of the control element 120 in this embodiment changes the frequency response of the coupled primary and secondary resonators, as explained with reference to FIGS. 2 to 4.

Figure 15:
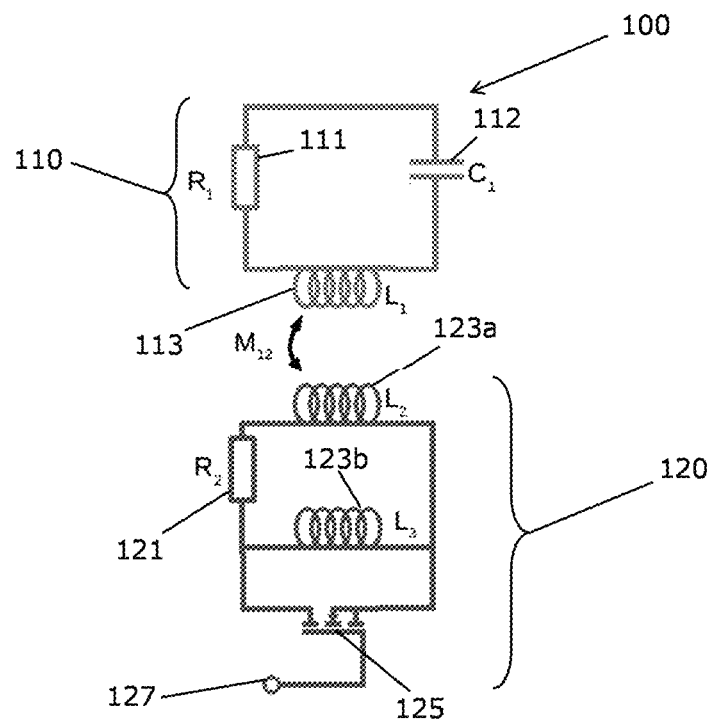
FIG. 15 is an controllable cell in which the control element comprises a first inductor, a second inductor, a resistor connected in series with the first and second inductor, and an active control component connected in parallel with the second inductor.

In the controllable cell 100 of FIG. 15, the control element 120 comprises a first inductor 123a, second inductor 123b, resistor 121 and active control component 125 (e.g. transistor). The first inductor 123a is inductively coupled to the inductor 113 of the primary resonator 110 (by mutual inductance $M_{12}$). The second inductor 123b is connected in parallel with the first inductor 123a, with the resistor 121 connected between the first and second inductors 123a, 123b. The active control component 125 (e.g. transistor) is connected in parallel with the second inductor 123b.

When the active control component 125 has a high resistance, current will flow around the loop through the second inductor 123b. When the active control component 125 has a low resistance current will bypass the second inductor 123b. The active control component 125 therefore controls the effective inductance of the control element 120. Since the inductance of the control element 120 contributes to the effective inductance of the primary resonator 110 (due to the coupling $M_{12}$), the change in inductance will result in a shift in the resonant frequency of the primary resonator 110, which may de-tune the primary resonator 110 from the adjacent cells of the waveguide 300.

Figure 16:
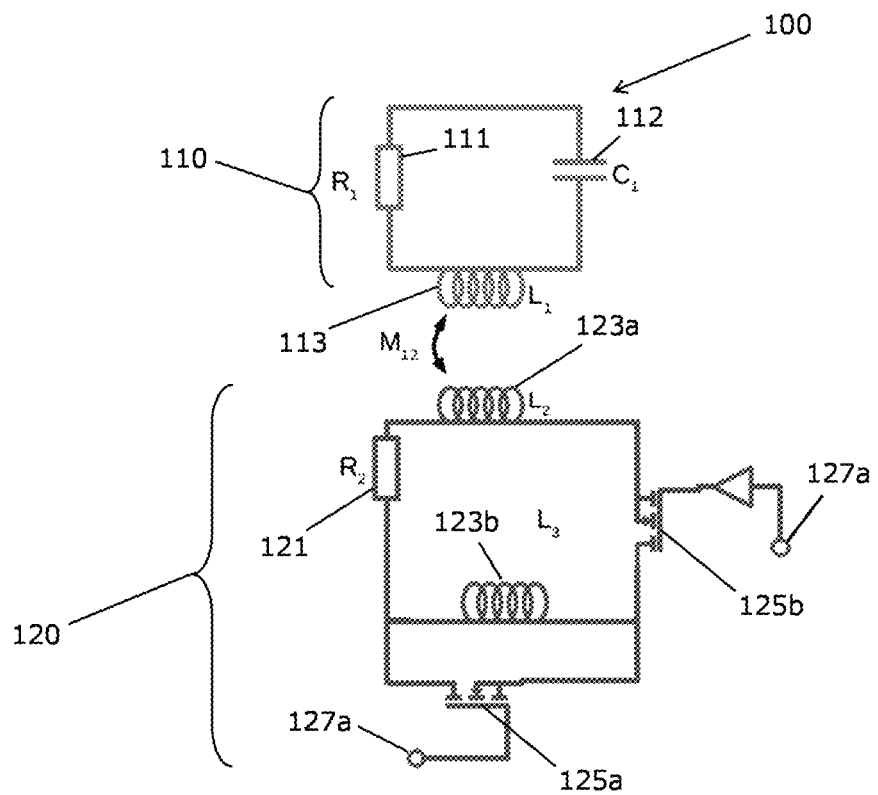
FIG. 16 is a controllable cell in which the control element comprises a first inductor, a second inductor, a resistor connected in series with the first and second inductor, a first active control component connected in parallel with the second inductor, and a second active control component connected in series between the first and second inductor.

The controllable cell of FIG. 16 combines the control approaches of FIGS. 13 and 15, providing a first and second active control component 125a, 125b. The first active control component 125a is arranged to modify the inductance of the control element 120, and the second active control component 125b is arranged to control the resistance of the loop. This cell 100 can thereby de-tune the primary resonator 110, and adjust the Q of the resonance.

Figure 17:
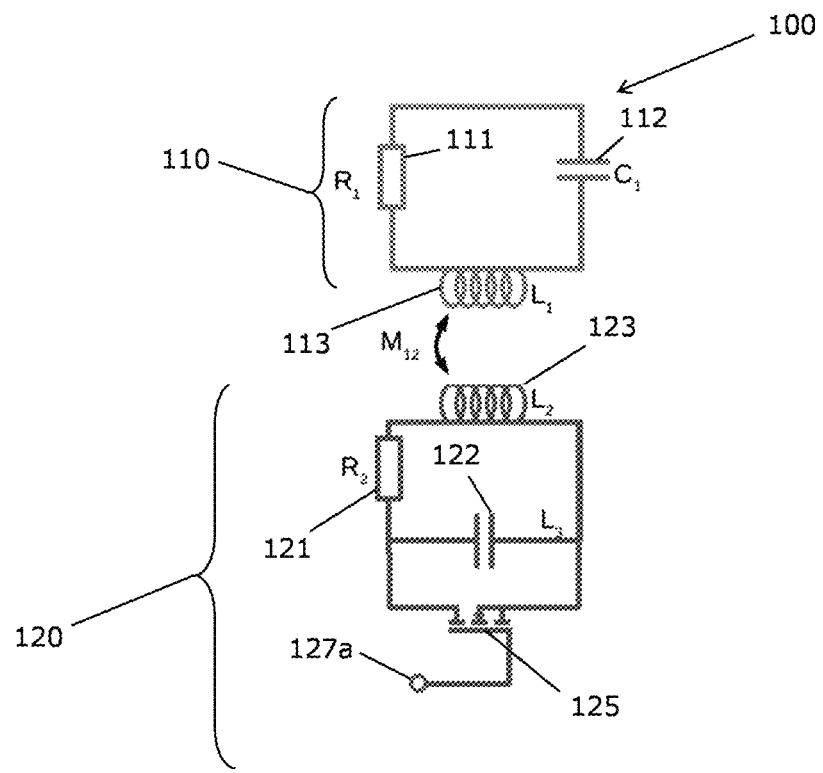
FIG. 17 is a controllable cell in which the control element comprises a secondary resonator having an inductor, resistor and capacitor, with an active control component connected in parallel with the capacitor.

In the controllable cell 100 of FIG. 17, the control element 120 comprises a secondary resonator, inductively coupled to the primary resonator 110. The control element 120 comprises an inductor 123, capacitor 122, resistor 121 and active control component 125 (e.g. transistor). The inductive coupling $M_{12}$ is between the inductors 113, 123 of the primary resonator and control element 120. The inductor 123, capacitor 122 and resistor 121 are connected in a series loop, and the active control component 125 is connected in parallel with the capacitor 122. The active control component 125 controls the effective capacitance of the control element 120.

Figure 18:
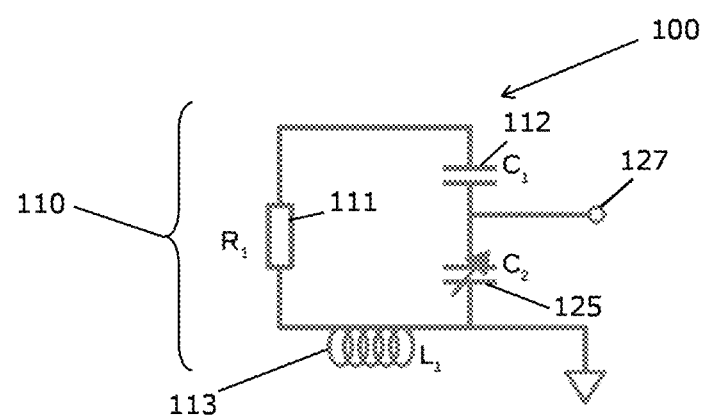
FIG. 18 is a controllable cell in which the control element comprises an active control component that includes a varactor arranged to vary the capacitance of the primary resonator.

In the controllable cell 100 of FIG. 18, an active control component 125 is incorporated within the primary resonator 110, in the form of a varactor. A fixed capacitor 112 is provided in series with the varactor 125, so that the voltage at the node 127 between the fixed capacitor 112 and varactor 125 can be varied to control the capacitance of the varactor 125. The effective capacitance of the primary resonator is therefore variable in response to a control signal in the form of a bias voltage at node 127. The resonant frequency of the primary resonator 110 is thereby adjustable in response to the control signal. Although a varactor provides a suitable implementation of a variable capacitor, other arrangements for varying the capacitance are also contemplated (e.g. a switched capacitor arrangement).

Figure 19:
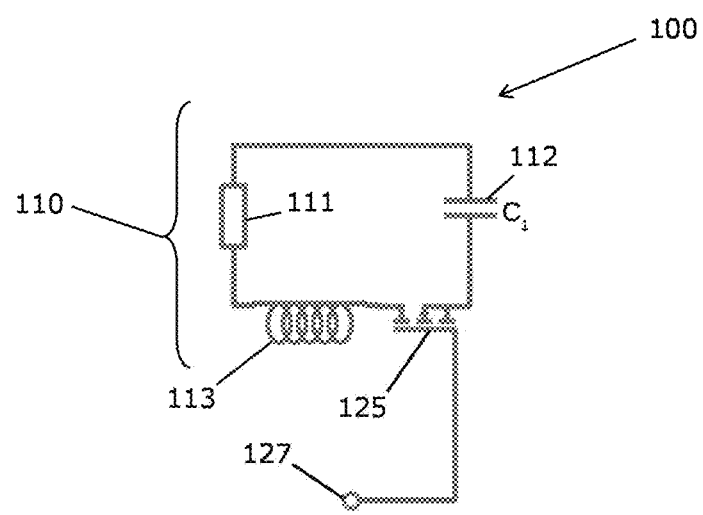
FIG. 19 is a controllable cell in which the control element comprises an active control component that includes a transistor connected in series between the capacitor and inductor of the primary resonator.

In the controllable cell 100 of FIG. 19, an active control component 125 with controllable resistance (e.g. a transistor) is incorporated within the primary resonator 110, in series with the fixed capacitor 112. The resistance of the primary resonator 110 is controllable with the active control element 125, which will vary the Q of the primary resonator 110.

Although a range of example embodiments have been described, the scope of the invention is defined only by the appended claims.

The invention claimed is:

1. A re-configurable magnetoinductive waveguide, comprising a plurality of resonator cells, wherein each resonator cell comprises a primary resonator that is inductively coupled to a primary resonator of at least one other resonator cell, and wherein at least one of the plurality of resonator cells is a controllable cell which further comprises a control element, the control element having an active control component that is operable to adjust the impedance of the primary resonator of the controllable cell in response to a control signal;
   wherein: the control element comprises a secondary resonator, the secondary resonator is inductively coupled to the primary resonator, and the active control component is arranged to vary the electrical properties of the secondary resonator in response to the control signal.

2. The waveguide of claim 1, wherein the secondary resonator comprises a capacitor, and the active control component is arranged in series or parallel with the capacitor.

3. The waveguide of claim 2, wherein the secondary resonator has a resonant frequency that is matched to a resonant frequency of the primary resonator to within 5%.

4. The waveguide of claim 1, wherein the control element comprises an inductor and the active control component is in series with the inductor and operable to vary the effective resistance of the control element in response to the control signal.

5. The waveguide , of claim 1, wherein the control element comprises an inductor, and the active control component is in parallel with the inductor and operable to vary the effective inductance of the control element in response to the control signal.

6. The waveguide of claim 5, wherein the control element comprises a further active control component in parallel with the inductor, and operable to vary the effective inductance of the control element in response to the control signal.

7. The waveguide of claim 1, wherein the active control component is conductively coupled to the primary resonator, and the active control component comprises a variable capacitor, arranged to vary a resonant frequency of the primary resonator.

8. The waveguide of claim 7, wherein the active control component is connected in series with a capacitor of the primary resonator, and is operable to vary the effective resistance of the primary resonator in response to the control signal.

9. The waveguide of claim 1, wherein the control element and corresponding primary resonator of the at least one controllable cell are disposed on different substrates.

10. The waveguide of claim 1, wherein the resonator cells are arranged in an three-dimensional, two-dimensional or one-dimensional array.

11. The waveguide of claim 1, wherein each primary resonator comprises a primary conducting loop.

12. The waveguide of claim 11, wherein the control element comprises a secondary conducting loop, adjacent to the primary conducting loop.

13. The waveguide of claim 12, wherein the secondary conducting loop is substantially concentric with the primary conducting loop.

14. The waveguide of claim 13, wherein the secondary conducting loop is offset from the primary conducting loop in a direction having a component parallel with an axis of the primary conducting loop.

15. The waveguide of claim 1, comprising a plurality of controllable cells, arranged in a two-dimensional array, wherein the active control components of each controllable cell are individually addressed using a plurality of row control lines and a plurality of column control lines.

16. The waveguide of claim 1, wherein the active control component is responsive to an optical signal.

17. A reconfigurable filter comprising the waveguide of claim 1.

18. A radio frequency processing apparatus comprising the waveguide of claim 1 and a plurality of antenna elements coupled to respective resonator cells, the waveguide configured to perform direct radio frequency processing of antenna signals provided to and/or received from the antenna elements.

19. The apparatus of claim 18, further comprising a microprocessor, arranged to provide control signals to the controllable cells of the waveguide to configure the waveguide to perform beam forming with the antenna signals.

* * * * *